United States Patent
Almonte

(10) Patent No.: US 7,602,192 B2
(45) Date of Patent: Oct. 13, 2009

(54) PASSIVE STATION POWER DISTRIBUTION FOR CABLE REDUCTION

(75) Inventor: Kenneth V. Almonte, Portland, OR (US)

(73) Assignee: Electro Scientific Industries, Inc., Portland, OR (US)

(*) Notice: Subject to any disclaimer, the term of this patent is extended or adjusted under 35 U.S.C. 154(b) by 547 days.

(21) Appl. No.: 11/565,370

(22) Filed: Nov. 30, 2006

(65) Prior Publication Data

US 2008/0129312 A1 Jun. 5, 2008

(51) Int. Cl.
G01R 31/12 (2006.01)
G01R 31/08 (2006.01)
G01R 31/28 (2006.01)

(52) U.S. Cl. .................. 324/548; 324/522; 324/158.1

(58) Field of Classification Search ............ 324/548, 324/522, 158.1
See application file for complete search history.

(56) References Cited

U.S. PATENT DOCUMENTS

| | | | |
|---|---|---|---|
| 3,978,461 A * | 8/1976 | DeLime, III | 340/517 |
| 4,931,721 A | 6/1990 | Berrigan et al. | |
| 5,034,749 A | 7/1991 | Jungblut et al. | |
| 5,057,772 A | 10/1991 | Bruno et al. | |
| 5,510,719 A | 4/1996 | Yamamoto | |
| 5,673,799 A | 10/1997 | Braden | |
| 5,677,634 A | 10/1997 | Cooke et al. | |
| 6,040,705 A | 3/2000 | Garcia et al. | |
| 6,043,665 A | 3/2000 | Nishioka et al. | |
| 6,100,707 A | 8/2000 | Baumann et al. | |
| 6,169,406 B1 | 1/2001 | Peschel | |
| 6,198,290 B1 | 3/2001 | Krinker | |
| 6,459,707 B1 | 10/2002 | Becker | |
| 6,518,777 B2 | 2/2003 | Kamitani et al. | |
| 6,605,951 B1 | 8/2003 | Cowan | |
| 6,677,637 B2 | 1/2004 | Bernstein et al. | |
| 6,714,028 B2 | 3/2004 | Garcia et al. | |
| 6,882,015 B2 | 4/2005 | Bernstein et al. | |
| 6,907,363 B1 | 6/2005 | Wyant et al. | |
| 7,173,432 B2 | 2/2007 | Garcia et al. | |
| 2005/0089027 A1 | 4/2005 | Colton | |
| 2008/0133153 A1* | 6/2008 | Almonte | 702/58 |

* cited by examiner

Primary Examiner—Amy He
(74) Attorney, Agent, or Firm—Young Basile

(57) ABSTRACT

A power distribution system for a rotary capacitor electrical tester includes a power source, an active station having plurality of test channels powered by the power source through cables connected to one side an upper contact module of the active station, and an opposition side a lower contact module of the active station being connectable to a test measurement device. A separate additional cable conductor inlet is located on the active station for receiving power from the power source. The power supplied through the extra additional cable is passed through the upper contact module of the active station without connecting to test channel and presents a power conductor outlet interface to a passive station immediately adjacent to the active station in order to reduce the number of cables required to connect between the power source and the various passive stations incorporated into the rotary capacitor electrical tester.

19 Claims, 2 Drawing Sheets

PASSIVE STATION POWER DISTRIBUTION FOR CABLE REDUCTION

FIELD OF THE INVENTION

The present invention relates to a power distribution system for a group of test stations for a rotary capacitor electrical tester, and in particular a power distribution system for a passive station to be powered indirectly through the active station located upstream of the passive station.

BACKGROUND

Adding test stations to a rotary capacitor electrical tester requires increasing the number of cables which must be routed to the upper contacts of the tester. Having a large number of cables not only increase cost and manufacturing complexity, but it also makes it more difficult for a machine to be changed into a different test sequence after it has been built. It also makes it difficult to pivot the upper contact assembly up and down because the large bundle of cables becomes very rigid.

For every track of every test station, there is coaxial wire that connects to a power source to provide the test voltage for that test channel. For example, on a four track system that has four test stations, there would be a total of sixteen coaxial cables going from the power source to the upper contacts. There are two basic types of test stations: active and passive. The main difference is where the lower contact connects to. For an active station, the lower contact connects to a tri-axial cable which then connects to a leakage current measurement device, such as an Agilent 4349B. There is an additional wire which connects the outer shield of the upper contact coaxial cable to the outer shield of the tri-axial cable to allow return currents to flow back to the power source. For a passive station, the lower contact is simply looped back to connect to the outer shield of the upper contact coaxial cable to allow return currents to flow back to the source. There is no measurement device on a passive station.

In the known configuration, the power source has dedicated outputs for active stations and dedicated outputs for passive station. An active station has a current source output, whereas a passive station has voltage source and a series resistor internal to the power source. To connect to the upper contacts, a cable from the active station output to the upper output is connected, and an identical cable is used to connect to the passive channel upper contacts. The lower contacts of the passive station is simply connected via a terminal block to a wire connected to the outer shield of the upper contacts. The lower contact cable is not coaxial, just a single wire. The lower contacts of the active station is a tri-axial cable which goes to another portion of the system, the Agilent 4349B as illustrated in FIG. 1.

SUMMARY

A power distribution system for a rotary capacitor electrical tester includes a power source, and an active station having a plurality of channels powered by the power source through cabling connectible to one side or an upper contact module of the active station. An opposite side or lower contact module of the active station is connectible to a test measurement device. A separate additional cable connector inlet is located on the active station for receiving power from the power source. The supplied power from the separate additional cable passes through the upper contact module of the active station without connecting to a test channel and presents a power conductor outlet to a passive station immediately adjacent to the active station.

In a power distribution system for a group of stations defining a rotary capacitor electrical tester, at least one active station is connectible to a power source to supply power through cabling to one side or an upper contact module of the active station, while an opposite side or lower contact module of the active station is connected to a test measurement device. The active station includes a separate additional cable connector inlet for receiving power from the power source. The power supplied through the separate additional cable connector inlet passes through the upper contact module of the active station without connecting to a test channel contact and presents a power conductor outlet to a passive station immediately adjacent to the active station.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 2:
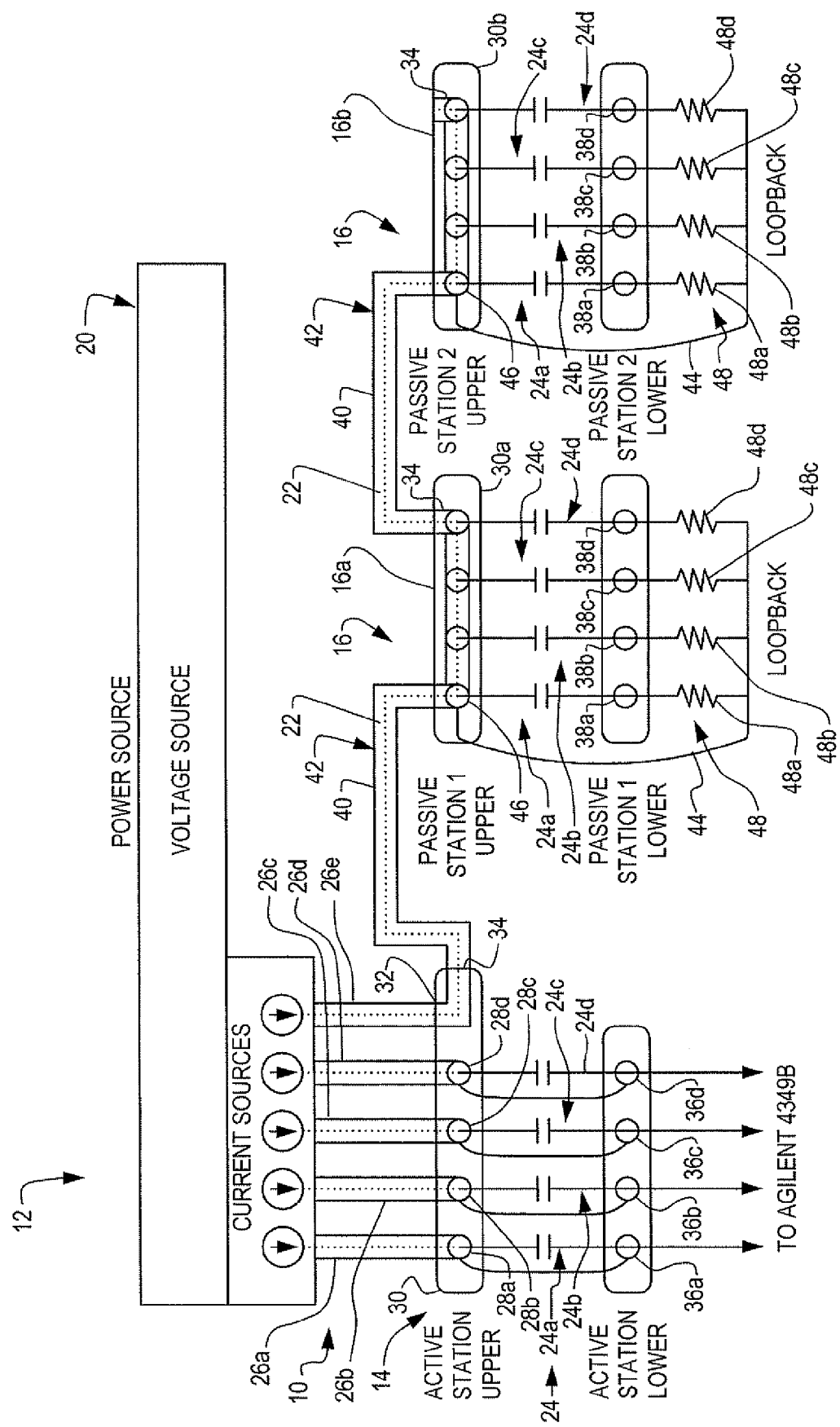
FIG. 2 is a schematic diagram illustrating a reduced number of cables for a power distribution system according to an embodiment of the present invention making indirect power distribution system connections between the upper and lower contact modules and the power source through the active station.

Referring now to FIG. 2, a power distribution system 10 for a rotary capacitor electrical tester 12 according to an embodiment of the present invention exploits the fact that an active station 14 must always precede a passive station 16. In practice, the number of passive stations 16 that follow an active station 14 can vary from zero passive stations up to four passive stations. Two passive stations 16a, 16b are shown for illustration purpose in FIG. 2. It is desirable to be able to change the number and sequence of active and passive stations 14, 16 with relative ease once the system has been built to a specific configuration.

Figure 1:
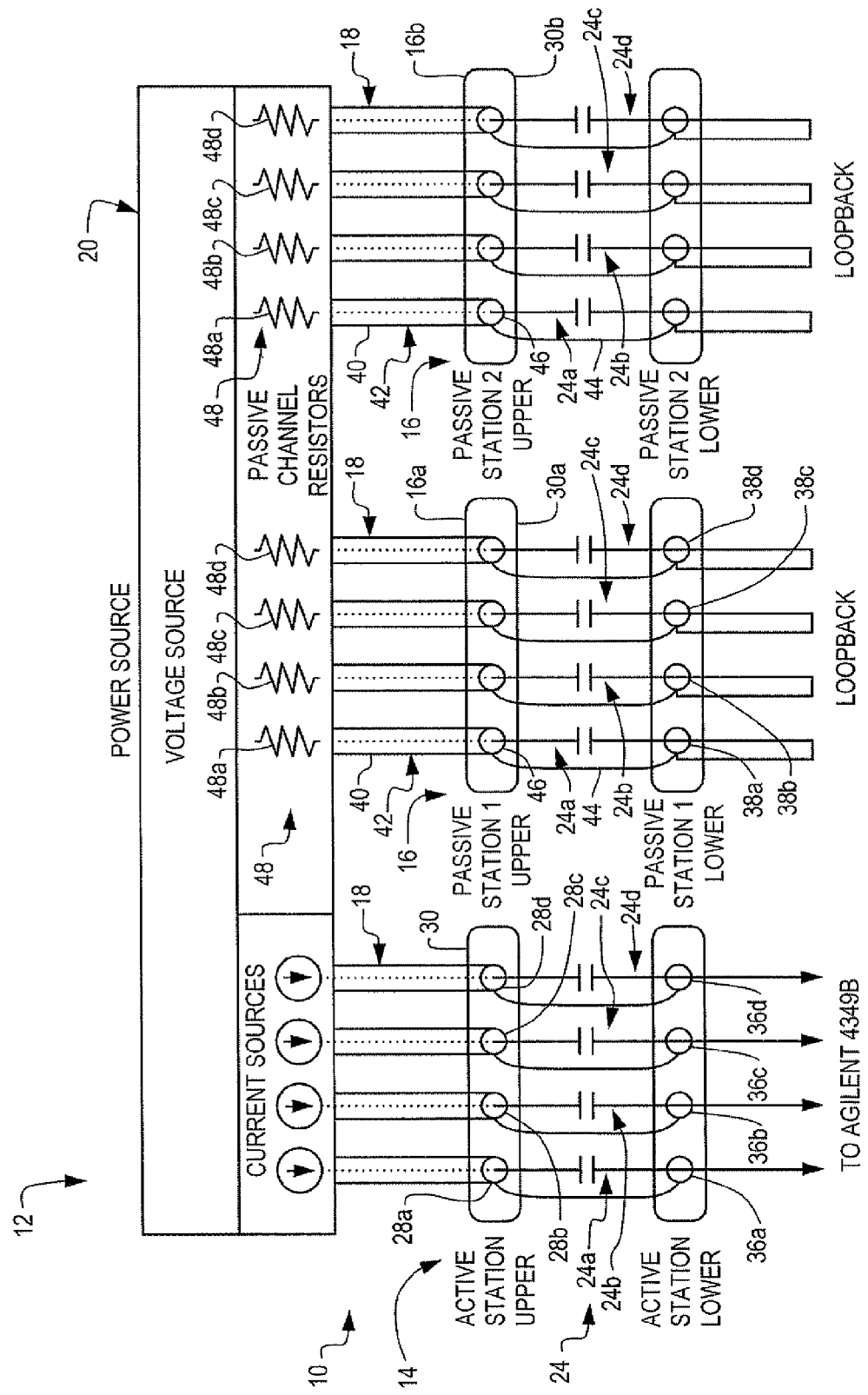
FIG. 1 is a schematic diagram of a known power distribution system with direct connections from upper and lower contacts to the power source.

Instead of having dedicated cables 18 as seen in FIG. 1 coming from the power source 20 to each of the passive stations 16a, 16b, the passive stations 16a, 16b according to an embodiment of the present invention as illustrated in FIG. 2 receive their power from a separate conductor 22 that comes from the station 14 or 16 immediately counterclockwise from the station to be powered. For the first passive station 16a, the station immediately counterclockwise to it is an active station 14. Assuming a four track system 24a-24d, this active station 14 would have five cables 26a-26e coming into it from the power source 20. The fifth cable 26e does not connect to a contact 28a-28d at the active station 14, but rather passes through the upper contact module 30 so that when it is connected to conductor inlet 32 located on the upper contact module 30 it would present a conductor outlet 34 to the station 16 adjacent to it counterclockwise. The passive station 16 can be connected to this conductor outlet 34, and in turn each station 16 presents an identical conductor outlet interface 34 to the station 16 adjacent to it clockwise. Therefore, a number of passive stations 16a, 16b with upper contact modules 30a, 30b can be mounted adjacent to one another after an active station 14, and the passive stations 16a, 16b can all receive their power through the single conductor outlet 34 located on the active station 14 as illustrated in FIG. 2.

The lower contacts 36a-36d of active station 14 can be identical to the previously known structure The passive channel lower contact 38a-38d are similar in that they will connect to the outer shield 40 of the upper contact coaxial cable 42. Since this outer shield 40 is not a cable, when using an embodiment according to the invention, this return wire 44 will connect to an area on the passive station contact module 30a, 30b that is equivalent to the outer shield 40 of the coaxial cable of the upper contact 46. The main difference of this approach is that the passive channel resisters 48 are no longer located inside the power source 20, but rather passive channel resistors 48 are located at the lower contacts 38a-38d in series with the loop back return wire 44. It should be noted that only one loop back return wire 44 needs to be connected to the outer shield 40 of the upper contact coaxial cable 42 equivalent, so the non-contact ends of all the resistors 48 can be tied together and connected to this loop back return wire 44. One resistor 48 is required per track 24a-24d in the system, so four resistors 48a-48d are required in the illustrated example according to an embodiment of the invention as illustrated in FIG. 2.

The benefit of this approach is that only one additional upper contact cable 26e is required from the power source 20 to the active station 14 to supply power to 16 passive channels. For a four track system as illustrated in the exemplary embodiment in FIG. 2, five coaxial cables 26a-26e will go to the upper contact module 30 to power one active station 14 and up to four passive stations 16a. Using the previously know configuration of FIG. 1, this would have required twenty cables to the upper contact modules 30. This reduction in cable count can reduce cost, reduce manufacturing time and complexity, and make it easier to reconfigure the sequence and type of test station after production. Being able to change configuration more easily will be more valuable to customers interested in doing process development using rotary electrical capacitor test machines. While the exemplary embodiment disclosed with respect to FIG. 2 has been described with between 0 to 4 passive channels per active channel, and up to 16 passive channels for a 4 track system, it should be recognized that the invention is not limited to these specific embodiments and can be used with any number of active and passive channels desired.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A power distribution system for a rotary capacitor electrical tester comprising:
    a power source;
    an active station having a plurality of test channels powered by the power source through cabling connectible to one side of the active station, and an opposite side of the active station being connectible to a test measurement device; and
    a separate additional cable conductor inlet located on the active station for receiving power from the power source, the power passing through a contact module of the station without connecting to a test channel and presenting a power conductor outlet to a passive station immediately adjacent to the active station.

2. The power distribution system of claim 1 further comprising:
    at least one passive station, each passive station including a single cable conductor inlet for receiving power indirectly from the power source, the supplied power passing through the contact module of an immediately adjacent station, the cable conductor passing through the contact module of each passive station and presenting a power conductor outlet to a station immediately adjacent to each passive station.

3. The power distribution system of claim 1 further comprising:
    a passive station connectible to the power source indirectly through a single cable attached to the power conductor outlet located on the active station.

4. The power distribution system of claim 1 further comprising:
    a power conductor inlet located on a first passive station, the power source connectible to the first passive station indirectly through a single cable attachable between the power conductor outlet of the active station and the power conductor inlet of the first passive station.

5. The power distribution system of claim 4 further comprising:
    the power source connectible indirectly to a power conductor inlet of a second passive station through a single cable attached through the power conductor outlet of the first passive station.

6. The power distribution system of claim 4 further comprising:
    an opposite side of each passive station looped back through a passive channel resistor.

7. The power distribution system of claim 1 further comprising:
    a single power cable attachable to a power conductor outlet located on the active station for supplying power indirectly from the power source to a power conductor inlet located on a passive station.

8. The power distribution system of claim 1 further comprising:
    a plurality of passive stations, each passive station powered indirectly by the power source with a connection through the power conductor outlet located on the active station.

9. The power distribution system of claim 8 further comprising:
    each passive station powered indirectly from by the power source through a single power cable connected to an adjacent station located upstream in a process sequence up to the active station.

10. In a power distribution system for a group of stations defining a rotary capacitor electrical tester including at least an active station, a power source connectible to feed power through cabling to one side of the active station and an opposite side of the active station being connected to a test measurement device, the improvement comprising:
    the active station including a separate additional cable conductor inlet for receiving power from the power source, the power passing through the contact module of the active station without connecting to a test channel contact and presenting a power conductor outlet to a passive station immediately adjacent to the active station.

11. The improvement of claim 10 further comprising:

at least one passive station, each passive station including a single cable conductor inlet for receiving power indirectly from the power source, the supplied power passing through the contact module of an immediately adjacent station, the cable conductor passing through the contact module of each passive station and presenting a power conductor outlet to a station immediately adjacent to each passive station.

12. The improvement of claim 10 further comprising:

a passive station connectible to the power source indirectly through a single cable attached to the power conductor outlet located on the active station.

13. The improvement of claim 10 further comprising:

a power conductor inlet located on a first passive station, the power source connectible to the first passive station indirectly through a single cable attachable between the power conductor outlet of the active station and the power conductor inlet of the first passive station.

14. The improvement of claim 13 further comprising:

the power source connectible indirectly to a power conductor inlet of a second passive station through a single cable attached through the power conductor outlet of the first passive station.

15. The improvement of claim 13 further comprising:

an opposite side of each passive station looped back through a passive channel resistor.

16. The improvement of claim 10 further comprising:

a single power cable attachable to a power conductor outlet located on the active station for supplying power indirectly from the power source to a power conductor inlet located on a passive station.

17. The improvement of claim 10 further comprising:

a plurality of passive stations, each passive station powered indirectly by the power source with a connection through the power conductor outlet located on the active station.

18. The improvement of claim 17 further comprising:

each passive station powered indirectly by the power source through a single power cable connected to an adjacent station located upstream in a process sequence up to the active station.

19. A power distribution system for a rotary capacitor electrical tester comprising:

a power source;

an active station having a plurality of test channels powered by the power source through cabling connectible to one side of the active station, and an opposite side of the active station being connectible to a test measurement device;

a separate additional cable conductor inlet located on the active station for receiving power from the power source, the power passing through a contact module of the station without connecting to a test channel and presenting a power conductor outlet to a station immediately adjacent to the active station;

at least one passive station, each passive station including a single cable conductor inlet for receiving power indirectly from the power source, the supplied power passing through the contact module of an immediately adjacent station, the cable conductor passing through the contact module of each passive station and presenting a power conductor outlet to a passive station immediately adjacent to each passive station, an opposite side of each passive station looped back through a passive channel resistor; and a single power cable attachable to a power conductor outlet located on the active station for supplying power indirectly from the power source to a power conductor inlet located on a passive station.

* * * * *